(12) United States Patent
Kobayasi et al.

(10) Patent No.: US 7,509,623 B2
(45) Date of Patent: Mar. 24, 2009

(54) MANUFACTURING METHOD OF SEMICONDUCTOR DEVICE

(75) Inventors: Sachiko Kobayasi, Chiba-ken (JP);
Toshiba Kotani, Kanagawa-ken (JP);
Satoshi Tanaka, Kanagawa-ken (JP);
Susumu Watanabe, Kanagawa-ken (JP);
Mitsuhiro Yano, Kanagawa-ken (JP)

(73) Assignee: Kabushiki Kaisha Toshiba (JP)

( * ) Notice: Subject to any disclaimer, the term of this patent is extended or adjusted under 35 U.S.C. 154(b) by 417 days.

(21) Appl. No.: 11/381,262

(22) Filed: May 2, 2006

(65) Prior Publication Data

US 2006/0190921 A1    Aug. 24, 2006

Related U.S. Application Data

(62) Division of application No. 10/331,005, filed on Dec. 27, 2002, now Pat. No. 7,065,739.

(30) Foreign Application Priority Data

Dec. 27, 2001    (JP) ................. JP 2001-398438

(51) Int. Cl.
*G06F 17/50* (2006.01)
*G03F 1/00* (2006.01)
*G03F 7/00* (2006.01)

(52) U.S. Cl. ............... 716/21; 716/18; 716/19; 430/5; 430/311

(58) Field of Classification Search ............. 716/18–21; 430/5, 311
See application file for complete search history.

(56) References Cited

U.S. PATENT DOCUMENTS

| | | | |
|---|---|---|---|
| 5,740,068 A | 4/1998 | Liebmann et al. | |
| 5,862,264 A | 1/1999 | Ishikawa et al. | |
| 6,077,310 A | 6/2000 | Yamamoto et al. | |
| 6,238,824 B1 | 5/2001 | Futrell et al. | |
| 6,335,981 B1 | 1/2002 | Harazaki | |
| 6,370,679 B1 | 4/2002 | Chang et al. | |
| 6,539,521 B1 | 3/2003 | Pierrat et al. | |
| 6,574,784 B1 | 6/2003 | Lippincott et al. | |
| 6,601,231 B2 | 7/2003 | LaCour | |
| 6,817,003 B2 | 11/2004 | Lippincott et al. | |
| 6,952,818 B2 * | 10/2005 | Ikeuchi | 430/311 |
| 7,062,396 B2 * | 6/2006 | Ogawa | 702/85 |

(Continued)

FOREIGN PATENT DOCUMENTS

JP    9-311107    12/1997

(Continued)

*Primary Examiner*—Helen Rossoshek
(74) *Attorney, Agent, or Firm*—Kilpatrick Stockton LLP

(57) ABSTRACT

A pattern correction method executed by a computer includes a first correction and a second correction. The first correction is executed by calculating a correction value, in consideration for an optical proximity effect, for edges (first edges) meeting a condition among the edges constituting a designed pattern. Subsequently, The second correction is executed for an edge (second edge) which does not meet the condition, by use of the correction value of any one of the edges (first edges) adjacent to the second edge among the first edges for which the first correction is executed, thus connecting the corrected first edge and the corrected second edge by a line segment. The pattern is corrected to a shape suitable for a mask drawing and a check with simple processing.

11 Claims, 14 Drawing Sheets

U.S. PATENT DOCUMENTS

| | | | |
|---|---|---|---|
| 7,263,684 B2 * | 8/2007 | Aton | 716/21 |
| 7,337,426 B2 * | 2/2008 | Kotani et al. | 716/21 |
| 2003/0203287 A1 * | 10/2003 | Miyagawa | 430/5 |
| 2004/0230930 A1 | 11/2004 | Lippincott et al. | |

FOREIGN PATENT DOCUMENTS

| | | |
|---|---|---|
| JP | 11-65089 | 3/1999 |
| JP | 2000-181046 | 6/2000 |
| JP | 2000-187314 | 7/2000 |
| JP | 2004-294551 | 10/2001 |
| JP | 2003-322945 | 11/2003 |

\* cited by examiner

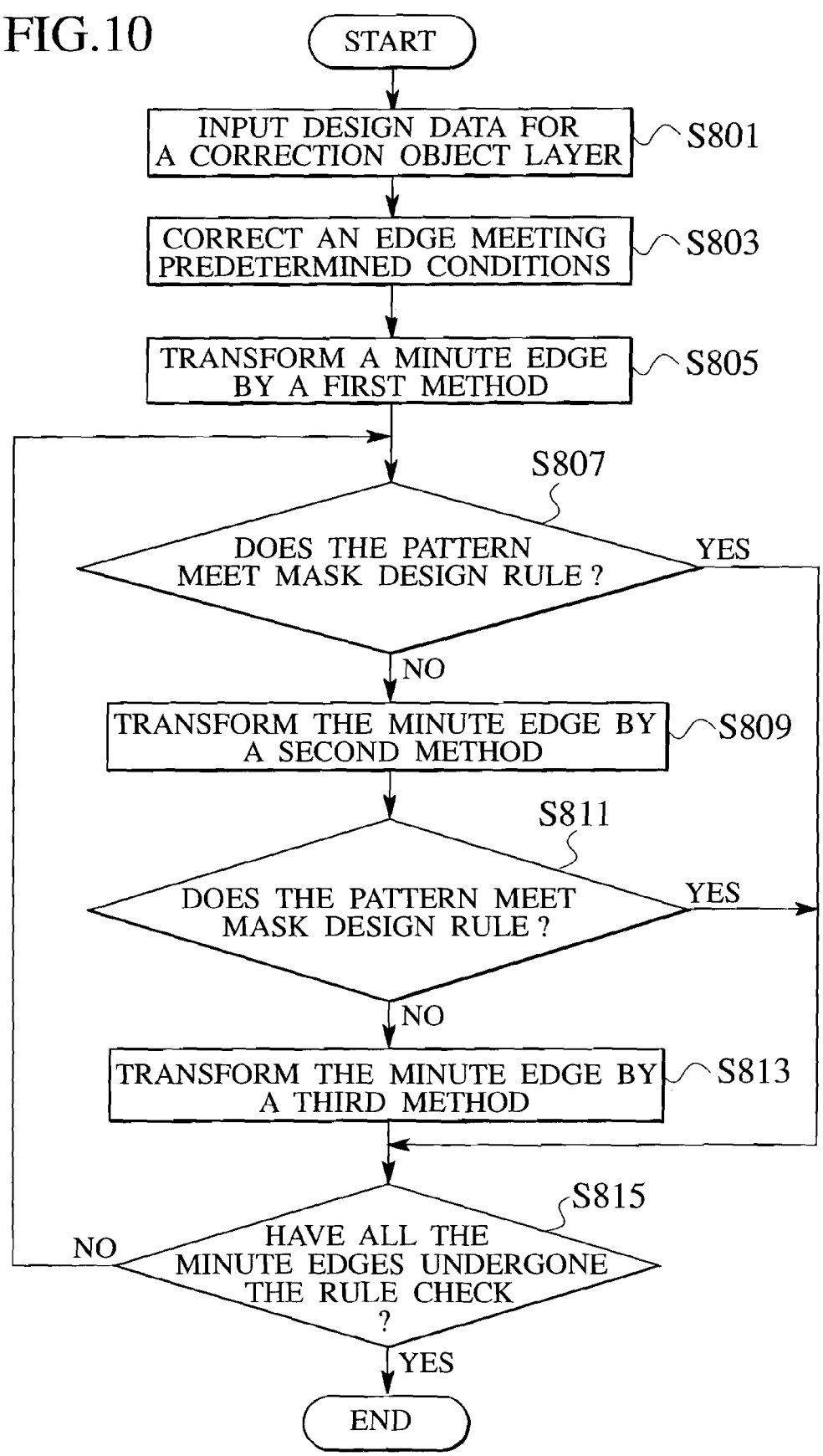

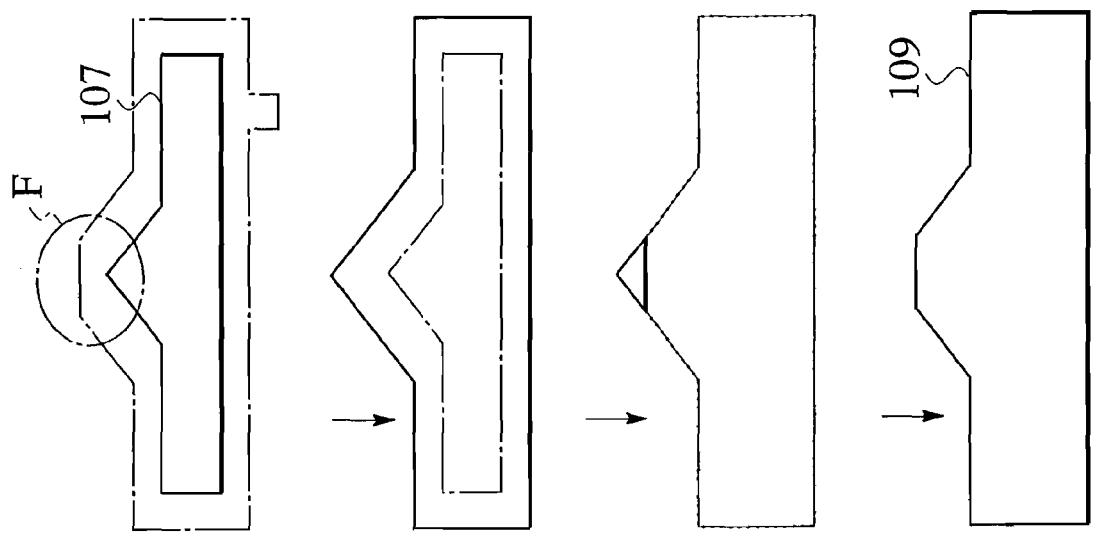
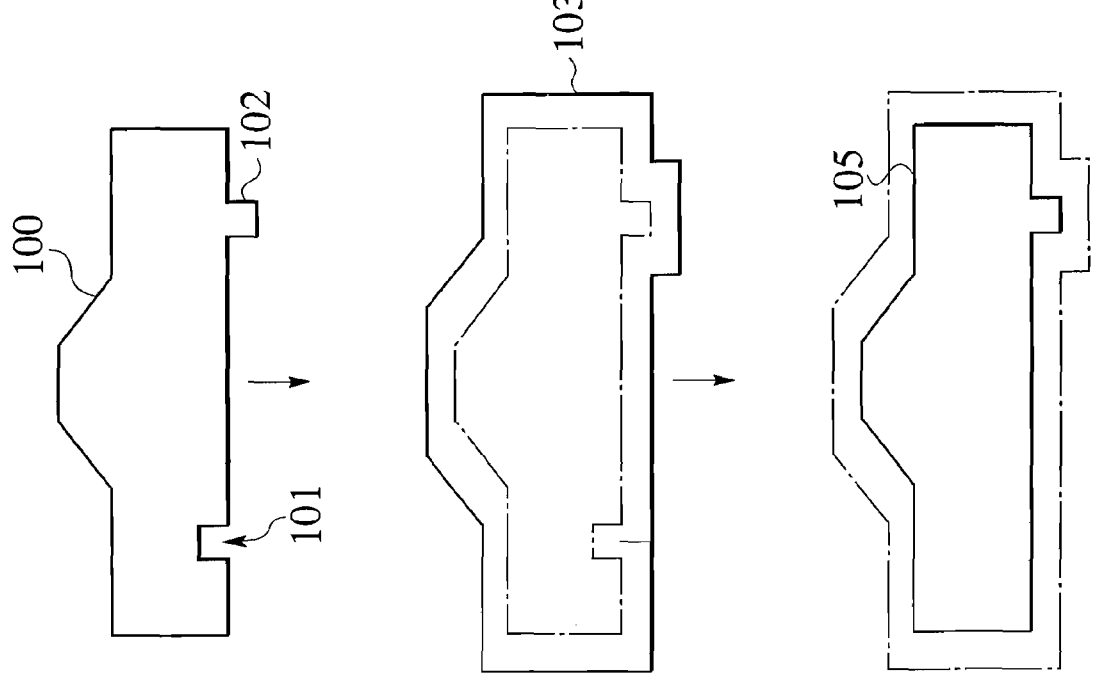

MANUFACTURING METHOD OF SEMICONDUCTOR DEVICE

CROSS-REFERENCE TO RELATED APPLICATION

This application is a divisional application of application Ser. No. 10/331,005 filed Dec. 27, 2002

This application is based upon and claims the benefit of priority from the prior Japanese Patent Application P2001-398438 filed on Dec. 27, 2001, the entire contents of which are incorporated herein by reference.

BACKGROUND OF THE INVENTION

1. Field of the Invention

The present invention relates to a pattern correction required in lithography processing of semiconductor integrated circuits and liquid panels, and more particularly to a correction technology of a mask pattern for performing faithful pattern transfer to a design pattern.

2. Description of the Related Art

In a photolithography technology used in manufacturing processing of semiconductor integrated circuit and liquid crystal panels, an optical proximity effect has become more serious problem as an integrated degree more increases and design rules become more critical.

An optical proximity effect is phenomenon in which the design pattern is not transferred on a wafer in the intended shape and dimension. For example, such phenomenon that the dimension of a line pattern reduces in its long side direction or the corner portion of an L-shape line pattern is transferred in a round shape is the typical optical proximity effect. Although the optical proximity effect has originally meant an effect due to optical factors in pattern transfer, now it means an effect caused through the entire wafer processes.

When the optical proximity effect arises, deviation between the design pattern and a pattern actually formed occurs, and it is impossible to achieve desired device performance. Therefore, an optical proximity effect correction (OPC) is required to reproduce a pattern having the designed dimension and shape on a wafer. The optical proximity effect correction means changing selectively the shape of the pattern or the like on a mask in advance in consideration of a process conversion difference.

Various techniques have already proposed and carried out for the optical proximity effect correction There are a simulation-based and a rule-based (alternatively referred to as a model based) methods as a method to prepare mask data by automatically executing the optical proximity effect correction (hereinafter referred to as "OPC" depending on the situation) on design data. The simulation-based OPC is a method in which an optical image in a mask pattern layout is calculated before a correction, a portion deviating from the pattern is detected, and the detected portion is corrected. This method shows high correction precision although much calculation amount is required, and is used for calculating a correction value for a line segment or an edge having importance among line segments and edges composing the pattern.

The rule-based OPC is a method to execute a correction such as mask bias according to rules. This method showing a high processing speed, determines the correction value according to predetermined rules, for each edge of a figure contained in a design layout to apply the correction value for an optical proximity effect correction.

In the conventional optical proximity effect correction, edges not meeting predetermined conditions, for example, edges having length shorter than predetermined values (hereinafter referred to as "minute edges"), are excluded from being subjected to the OPC. The OPC is executed only for edges having length longer than predetermined value. As a matter of course, the minute edges originally exist in the stage of design data, and they often occur as results of repeatedly performed complicated and minute pattern data processing prior to the OPC. If the minute edges exist, minute projections, minute hollows, acute projections and acute hollows are caused by the OPC itself and pattern data processing subsequent to the OPC. They are factors adversely affecting a mask drawing and a check FIGS. 1A and 1B illustrate the examples of occurrence of projections and hollows caused by the conventional optical proximity effect correction. In FIG. 1A, only edges 1002 and 1003 having length longer than predetermined values are objects of the OPC in a pattern 1001 shown by solid lines, which has not subjected to the OPC yet. The OPC to thicken the pattern was executed for the edges 1002 and 1003 while leaving a minute edge 1004 excluded from the object of the OPC at an initial position. As a result of the OPC, the corrected pattern 1005 illustrated by the dotted lines is obtained. In the pattern 1005 after the OPC, the minute hollow 1006 occurs.

In the case of FIG. 1B, in the pattern 1010 illustrated by the solid lines, which has not subjected to the OPC yet, the edges 1012 and 1013 meeting conditions are similarly objects of the OPC, and the minute edges 1014 and 1015 are excluded from the object of the OPC. As a result, the pattern 1020 illustrated by the dotted lines is obtained. In this case, an acute projection and a slanting slit occur as illustrated by the circle A.

These minute projections (acute pattern) and these minute hollows increase a data amount uselessly, and decrease mask drawing precision. In addition, a mask drawing time becomes much longer. In checking mask defects process, they are apt to be detected as suspected failure, and much time and labor are needed for error detection.

In order to erase minute unevenness caused by the OPC, a method has been known, in which a slightly thick/thin bias or a slightly thin/thick bias is applied to the whole of a layout after the OPC, and minute projections and minute hollows are erased. However, projections and hollows may be caused additionally at unexpected spots by performing such bias processing. Also disadvantageous deformation such as a short and slit may occur. Moreover, there are many shapes having projections and hollows that are not erased only by the bias processing.

For example, as shown in FIG. 2A, the pattern 1030 obtained by the OPC processing has the minute hollow 1031 and the minute projection 1032. When slightly thick bias is first applied to the pattern 1030, the hollow 1031 is made to be flat, and the pattern 1035 illustrated in FIG. 2B is obtained. When slightly thin bias is further applied to the pattern 1035, the pattern 1037 having dimensions which are almost equal to those of the initial pattern is obtained as shown in FIG. 2C. In this situation, although the hollow 1031 is erased, the extremely acute hollow 1033 occurs.

When slightly thin bias is further applied to the pattern 1037, the pattern 1039 in which the projection 1032 is erased is obtained as shown in FIG. 2D. Then, by applying slightly thick bias to the pattern 1039, the pattern 1041 in which the hollow 1031 and the projection 1032 are finally erased is obtained as shown in FIG. 2E.

However, the acute hollow 1033 illustrated by the circle B is not erased in spite the bias processing is executed over and over again. The acute hollow on the mask pattern is undesirable because this acute hollow is a cause of suspected error detection in checking the mask process as well as a cause of a decrease in mask drawing precision.

On the other hand, when the correction values for the respective minute edges, which are left at initial positions in the pattern, and unevenness are individually calculated by the simulation-based method after the OPC processing, the calculation amount and the processing time are enormous, and such individual calculations are impractical.

SUMMARY OF THE INVENTION

A pattern correction method of a first aspect according to the present invention is the one executed by a computer, which includes executing a first correction and a second correction. The first correction is executed by calculating correction values for at least one of first edges meeting conditions among the edges constituting a designed pattern in consideration for an optical proximity effect and correcting the one or more first edges with the correction values. The second correction is executed for a second edge which does not meet the conditions, by correcting the second edge with the correction value of any one of the first edges adjacent to the second edge among the first edges for which the first correction is executed. Then the corrected first edge and the corrected second edge are connected by a line segment.

The conditions are, for example, as follows. The length of an edge is equal to a predetermined values or more, an edge does not form a vertical or slanted step difference which is shorter than a predetermined height, and so on. In this case, the first correction (optical proximity effect correction) is executed, and then the second correction is executed for a minute edge which does not meet the conditions.

A pattern correction method of a second aspect according to the present invention is the one executed by a computer. In the method includes designing a pattern to be formed on a wafer; and executing a correction for at least one of edges meeting conditions among edges constituting the pattern in consideration for an optical proximity effect are performed. Next, deciding whether or not the corrected pattern includes minute pattern having no effect on a transferred image onto the wafer; executing bias processing in combination of bias for thickening the whole of the pattern after the correction and bias for thinning it when the corrected pattern includes the minute pattern are performed. Then after the bias processing, a logic operation is executed, thus erasing an acute pattern caused by the bias processing.

A manufacturing method of a semiconductor device of a third aspect according to the present invention includes preparing design data in which patterns formed on a semiconductor wafer are designed for respective layers, inputting the design data for each layer, and preparing mask data for the pattern included in each design data. In preparing the mask data, a first correction is executed by calculating correction values for at least one of first edges meeting conditions in consideration for an optical proximity effect, and a second correction is executed for a second edge which does not meet the conditions, by use of the correction value of the first edge adjacent to the second edge which does not meet the conditions among the first edges for which the first correction has been executed, and the corrected first edge and the corrected second edge are connected. Furthermore, the method includes preparing a mask based on the mask data; and transferring the pattern onto the semiconductor wafer by use of the mask.

A manufacturing method of a semiconductor device of a fourth aspect according to the present invention includes preparing design data in which patterns to be formed on a semiconductor wafer are designed for respective layers; inputting the design data for each layer, and preparing mask data for the pattern included in each design data. In preparing the mask data, edges meeting conditions are corrected in consideration for an optical proximity effect. Further, the method includes deciding whether or not the pattern after the foregoing correction includes minute pattern having no effect on a transferred image onto the wafer; executing bias processing in combination of bias for thickening the whole of the pattern after the correction and bias for thinning it when the corrected pattern includes the minute pattern. Furthermore the method includes executing a predetermined logic operation after the bias processing, thus erasing an acute pattern caused by the bias processing; preparing a mask based on the mask data prepared in the foregoing manner; and transferring the pattern onto the semiconductor wafer by use of the mask.

BRIEF DESCRIPTION OF THE DRAWINGS

FIG. 10 is a flowchart illustrating the pattern correction method corresponding to FIGS. 9A to 9C.

FIGS. 14A to 14G are plan views illustrating variations of the pattern correction method according to the fifth embodiment of the present invention.

DETAILED DESCRIPTION OF THE EMBODIMENTS

First Embodiment

Figure 3A:
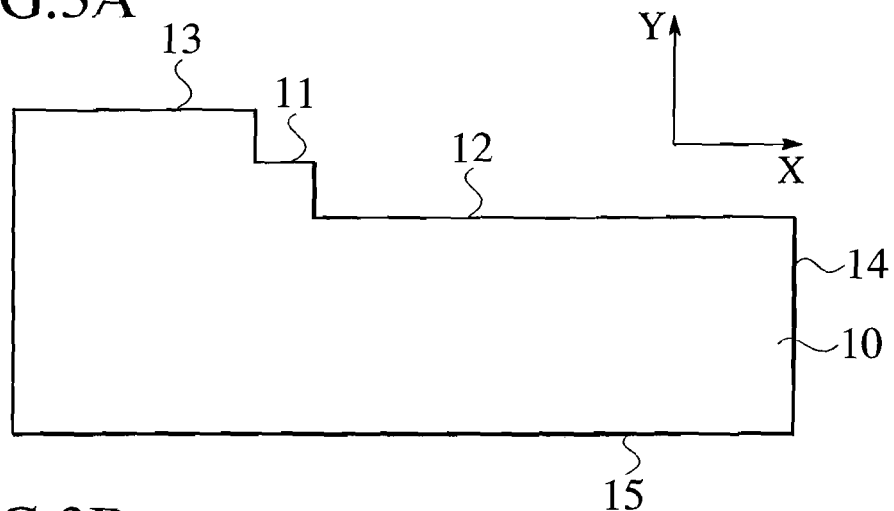
FIGS. 3A to 3C are plan views illustrating a pattern correction method according to a fist embodiment of the present invention.
Figure 3B:
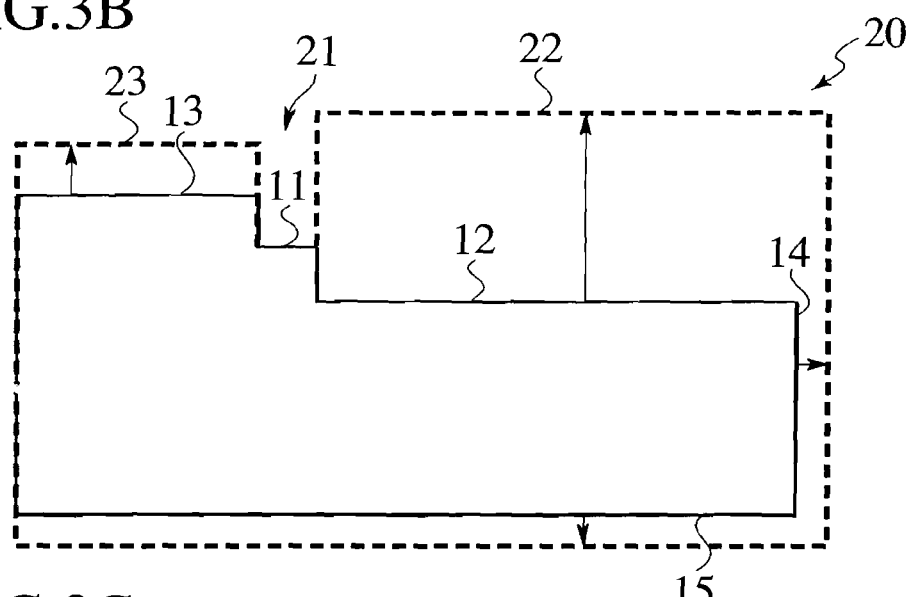
Figure 3C:
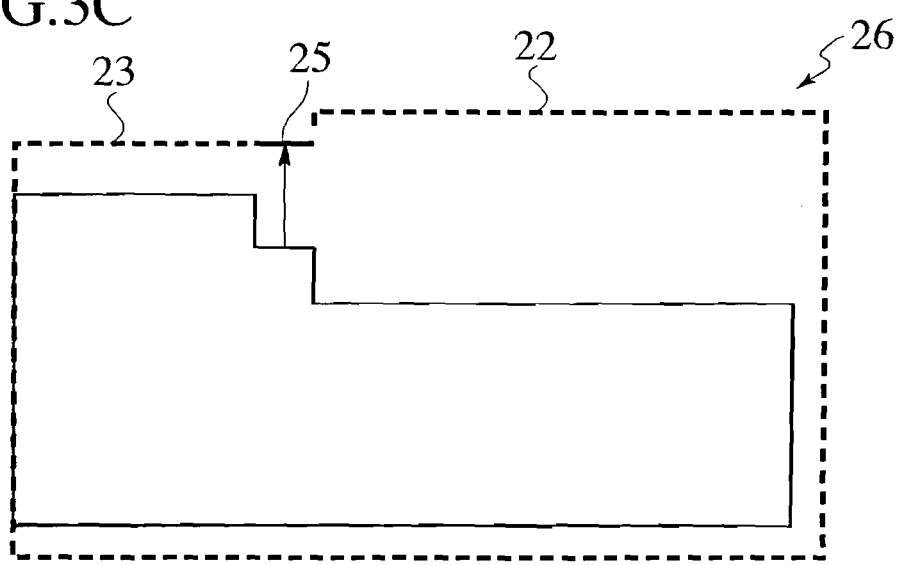

FIGS. 3A to 3C illustrate a pattern correction method according to a first embodiment of the present invention. This embodiment will be described by taking as an example a pattern correction method for performing processing using a computer on which, for example, computer aided design (CAD) software operates. As shown in FIG. 3A, a case where the design pattern 10 including the minute edge 11 is processed is considered. The pattern 10 is a figure composed of only horizontal and vertical lines extending in the X and Y-directions.

As shown in FIG. 3B, the minute edge 11 is excluded from an object of OPC regarding it as an edge which is shorter than a predetermined length, and corrected positions of the edges 12 to 15 which meet conditions are calculated based on an ordinary OPC processing. Based on the calculation results, the pattern 10 is expanded by predetermined amounts in the X and Y-directions thus giving a pattern 20 after the OPC, which is illustrated by dotted lines.

The OPC correction value is calculated in simulation in accordance with characteristics of aimed edges (e.g. required precision) and positional relation with circumferential patterns. Accordingly, in FIG. 3B, for example, the OPC correction value (Y-coordinate value after the correction) of the edge 12 is set to be larger than the OPC correction value (Y-coordinate value after the correction) of the edge 13. Furthermore, when the peripheral patterns are positioned near the edge 13, the correction pattern 20 in which the correction value for the edge 13 is made small is obtained as shown in FIG. 3B. When the peripheral patterns are positioned near the edge 12, the correction value of the edge 12 is sometimes small.

In this stage, since the minute edge 11 remains at the initial position, as it is not processed, the pattern 20 after the OPC includes the minute hollow 21.

Next, as shown in FIG. 3C, simple processing is executed for the minute edge 11 that was excluded from the object of the OPC, by use of the results of the OPC processing. Specifically, the minute edge 11 is made to be coincident with the OPC correction value (Y-coordinate value after the OPC correction) of any one of the adjacent edges 12 and 13 extending the same direction as that of the minute edge 11 (in the example of FIG. 3C, the X-direction). In the example of FIG. 3C, the minute edge 11 is made to be coincident with the smaller OPC correction value (the Y-coordinate after the correction), that is the correction value of the edge 13. As a result, the minute edge 11 becomes the new line segment 25 aligned with the adjacent edge 23 after the OPC, and the hollow 21 is erased.

The boundary between the new line segment 25 and the other adjacent edge 22 after the OPC forms a step difference in the Y-direction, that is, the step difference having a right angle relative to the new line segment 25. To be more concrete, the line segment 25 made to be coincident with the one adjacent edge 23 is connected to the other adjacent line 22 by a line segment extending in the direction perpendicular to the minute line segment 25. Thus, the pattern 26 illustrated by the dotted line, which does not include acute portions, is obtained.

This method does not require applications of slightly thick/thin bias to the whole of the layout pattern obtained by the OPC processing of FIG. 3B. Furthermore, this method does not require the individual simulation calculations for the minute edge 11, and the minute hollow 21 can be erased by use of the correction values of the adjacent edges as obtained by the ordinary OPC. As a result, both of the data amount and calculation amount of the mask pattern can be suppressed to the minimum, and the malfunctioning detection of suspected errors in check can be prevented.

Figure 4A:
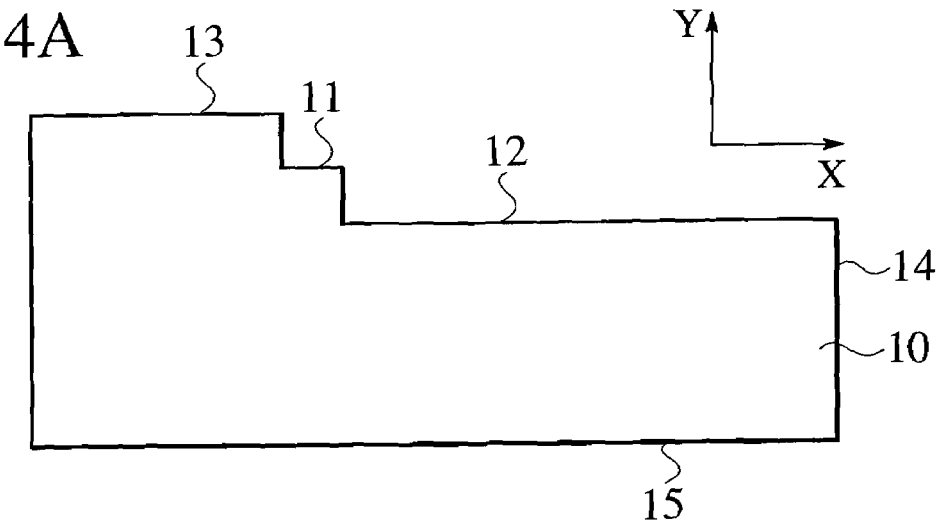
FIGS. 4A to 4C are plan views illustrating variations of the pattern correction method according to the first embodiment of the present invention.
Figure 4B:
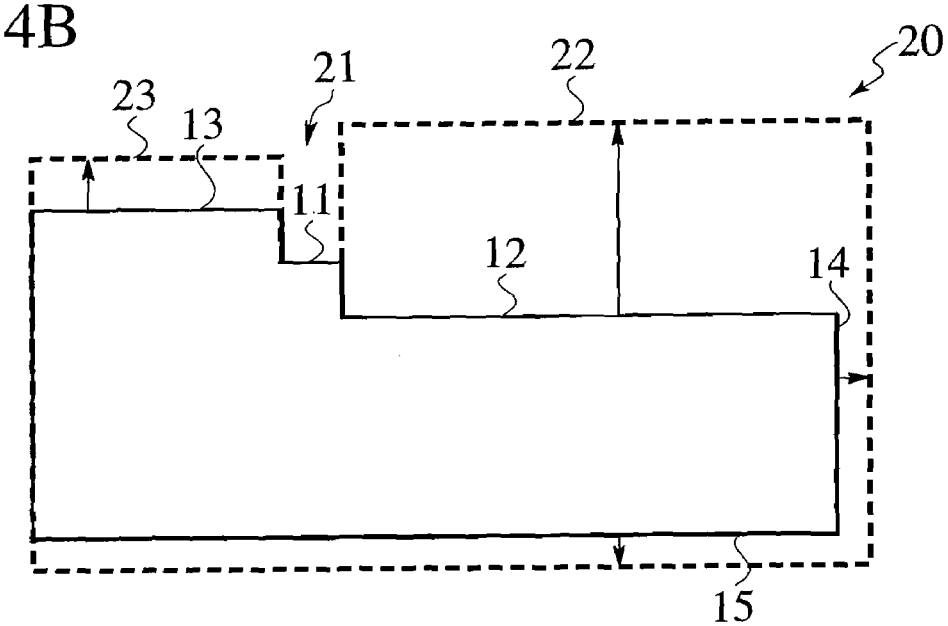
Figure 4C:
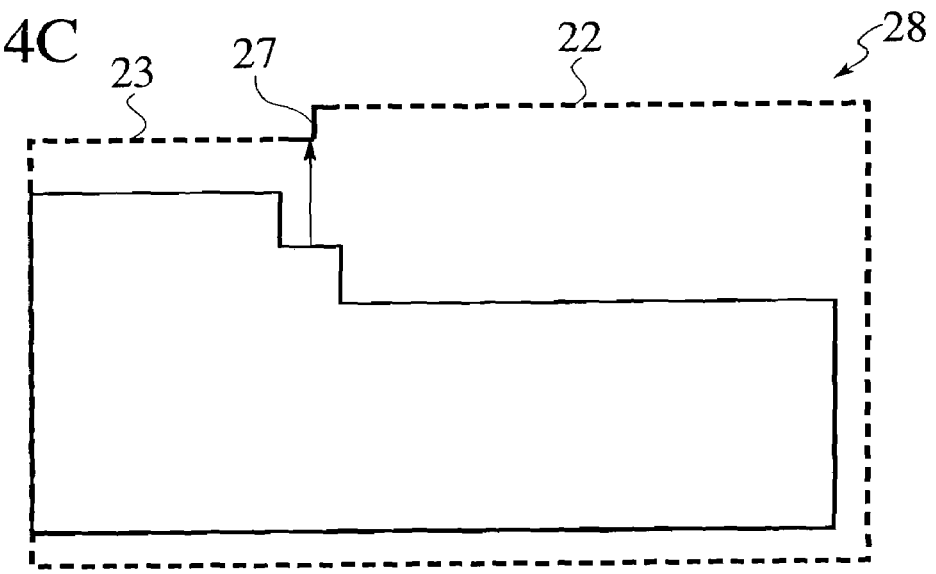

FIGS. 4A to 4C show variations of the method of FIGS. 3A to 3C. The OPC processing of FIGS. 3A and 3B are used for this method as they are. In FIG. 3C, though the minute edge 11 is made to be coincident with any one of the correction values of the adjacent edges after the correction extending to the same direction, the minute edge 11 is virtually split at the midpoint thereof and the each side of edge 11 is made to be respectively coincident with the correction values of each of the adjacent edges 12 and 13 in the method of FIG. 4C (the minute edge 11 is virtually split at the midpoint thereof and both sides of minute edge 11 match the adjacent 22 and 23). As a result, the minute edge is set to as a new line segment 27, and the left half of the edge 27 is aligned with the adjacent edge 23 after the OPC. The right half thereof is aligned with the other adjacent edge 22 after the OPC. The new line segment 27 has a step difference extending in the Y-direction at its midpoint. Thus, the pattern 28 illustrated by the dotted lines, which does not include an acute portion, is obtained.

The minute edge which is excluded from the object of the OPC is made to be coincident with each of the adjacent line segments after the OPC so as to be virtually split at its midpoint, whereby the pattern obtained after exposure more resembles to the design pattern.

Also in the method illustrated in FIGS. 4A to 4C, the minute hollow can be effectively erased by the correction values as they are obtained by the ordinary OPC, and the same effects as those of the method illustrated in FIGS. 3A to 3C can be achieved.

Figure 1A:
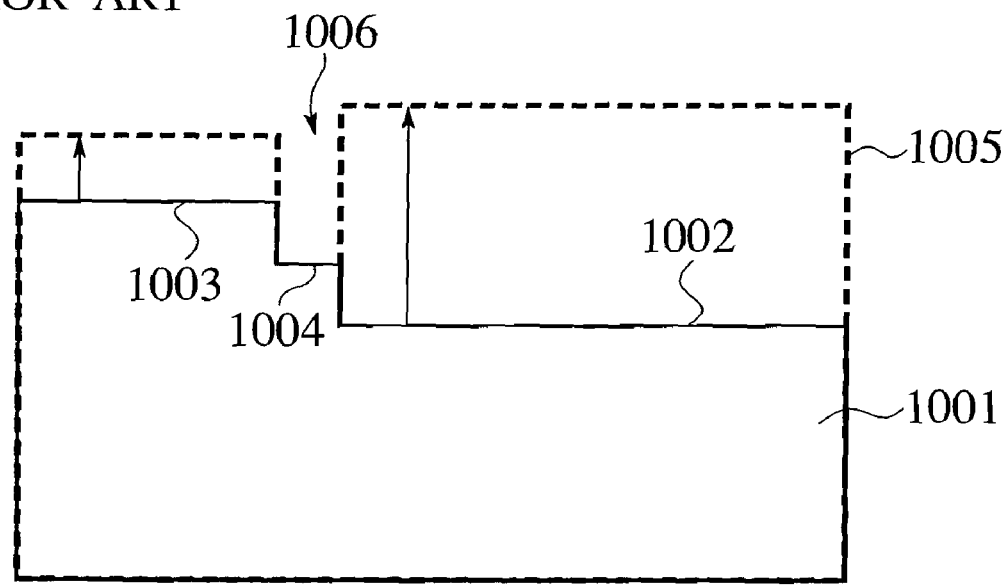
FIGS. 1A and 1B are plan views illustrating pattern having minute hollows caused by a conventional OPC (optical proximity effect correction).
Figure 1B:
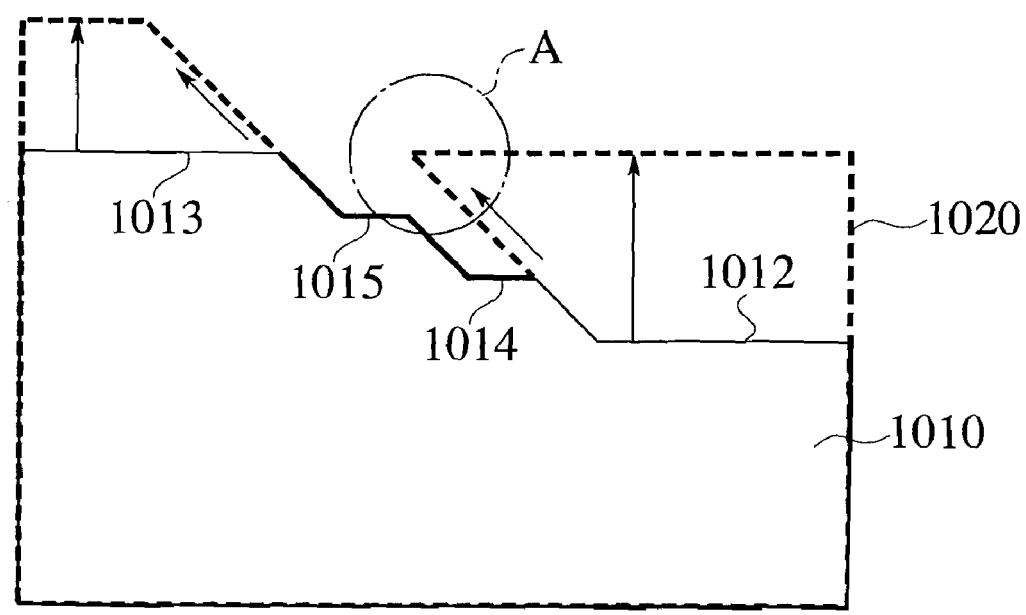
Figure 2A:
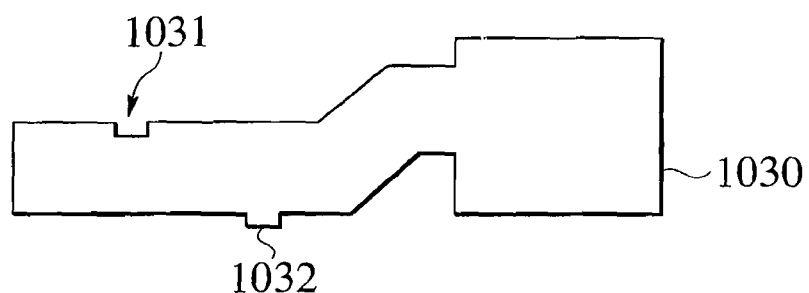
FIGS. 2A to 2E are plan views illustrating pattern having acute portions caused by conventional mask bias.
Figure 2B:
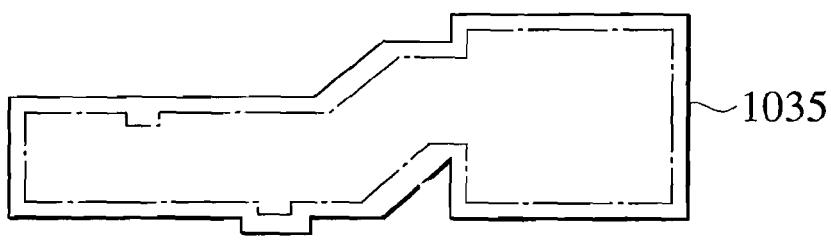
Figure 2C:
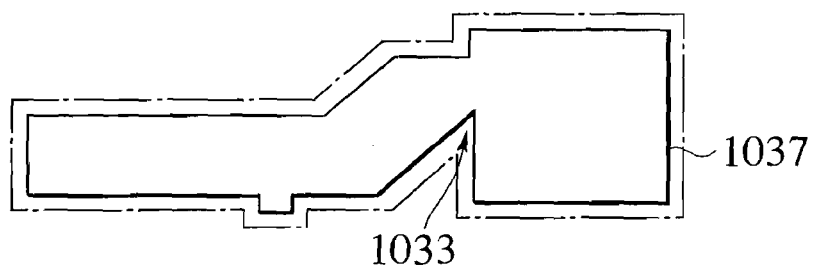
Figure 2D:
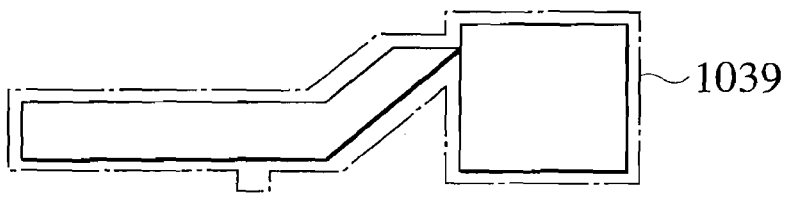
Figure 2E:
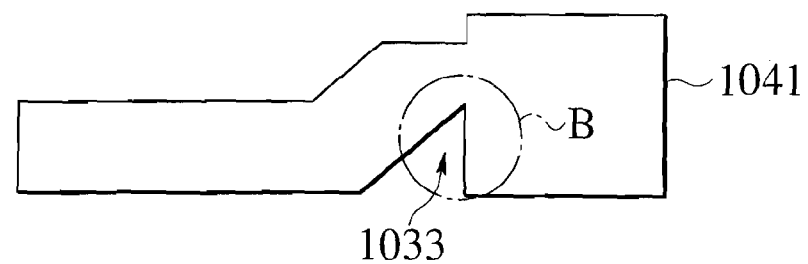

The correction processing after the OPC illustrated in FIGS. 2C and 3C may be combined with OPC, or alternatively may be performed separately from the OPC. When the correction processing after the OPC is combined with the OPC, the correction processing after the OPC can be constructed as one pattern correction program.

Second Embodiment

Figure 5A:
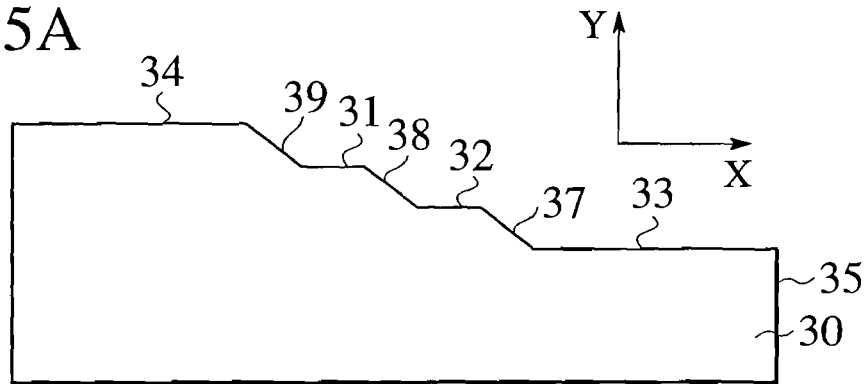
FIGS. 5A and 5D are plan views illustrating a pattern correction method according to a second embodiment of the present invention.
Figure 5B:
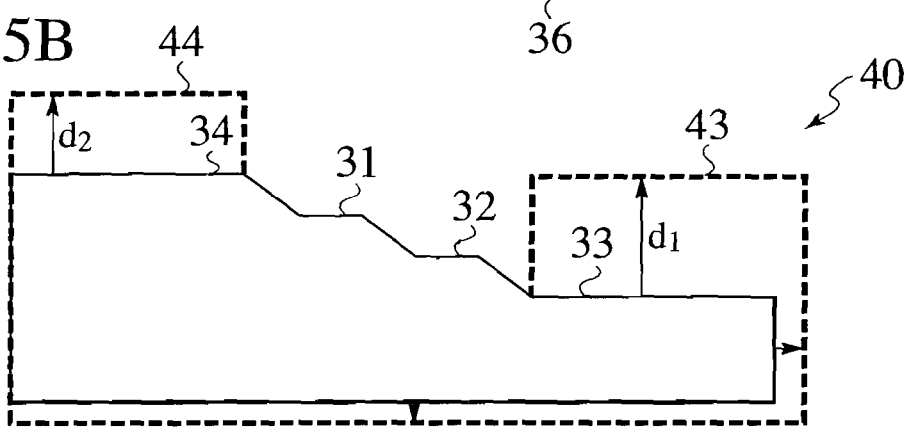

FIGS. 5A to 5D illustrate a pattern correction method according to a second embodiment of the present invention. In the second embodiment, the design pattern 30 including minute slanting step differences as shown in FIG. 5A is corrected. The slanting step difference includes the minute edges 31 and 32 in the rectangular coordinate axis direction and the minute lines 37 to 39 extending in slanting directions. In order to correct the pattern 30, edges meeting predetermined conditions, for example, the edges 33 to 36 having predetermined lengths or more are subjected to the OPC, and the respective correction values thereof are determined. A change amount for the edge 33 is assumed to be d1, and a change amount for the edge 34 is assumed to be d2. As a result, the edge 33 that is one edge adjacent to the slanting step difference becomes the line segment 43, and the edge 34 that is the other edge adjacent to the step difference becomes the line segment 44, thus obtaining the pattern 40 illustrated by the dotted lines.

Figure 5C:
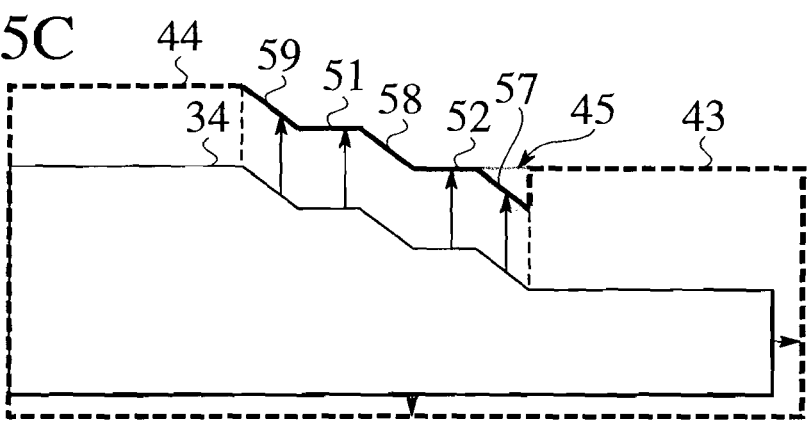

Next, as shown in FIG. 5C, simple processing is executed for the step difference constituted by the minute edges 31 and 32 and the slanting minute edges 37 to 39 by use of the correction values obtained in the former OPC processing. Specifically, the slanting step difference that is excluded from the object of the OPC is moved in parallel in accordance with the correction value of any one of the adjacent edges. Which correction value of the adjacent edge the parallel movement of the step difference accords with depends on factors such as the corrected direction and the relation with the peripheral patterns. In the example of FIG. 5C, the step difference is made to be coincident with the correction value of the adjacent edge 34, and the step difference is moved in parallel by an amount equivalent to the change amount d2. The direction of the parallel movement is the same as the direction in which the adjacent edges 33 and 34 are moved by the corrections thereof previously performed (expansion direction). In the example of FIG. 5C, the direction of the parallel movement is the Y-direction. Thus, the minute edges 51 and 52 and slanting lines 57 to 59 after the correction are obtained.

The slanting step difference after the parallel movement extends from one adjacent edge 44 after the OPC to the other adjacent edge after the OPC. However, the acute hollow 45 occurs between the step difference after the parallel movement and the other adjacent edge 43.

Figure 5D:
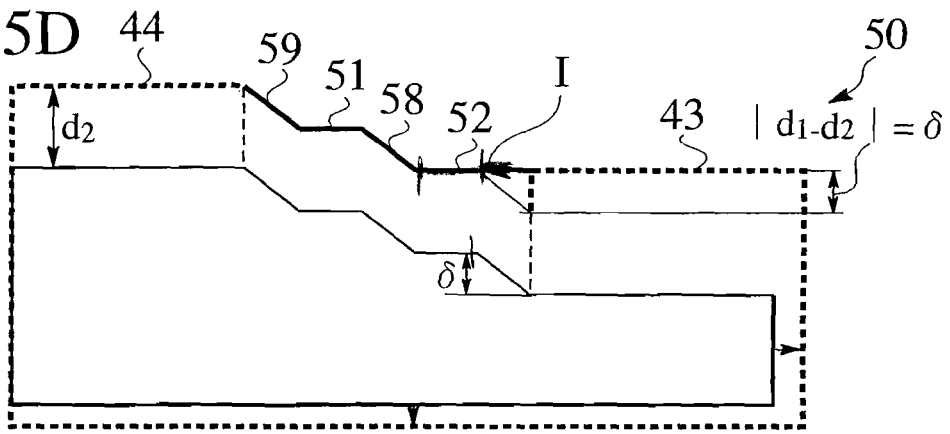

Accordingly, as show n in FIG. 5D, the acute hollow 45 is erased by a simple processing. Specifically, the other adjacent edge 43 after the OPC is extended in the direction thereof, and at the intersection point I of the adjacent edge 43 and the slanting step difference that has been moved in parallel, the pattern is connected to the slanting step difference.

In the example of FIG. 5D, since the difference |d1−d2| between the change amount d1 for the edge 33, that is a processing amount, and the change amount d2 for the edge 34, that is a processing amount, is equal to a step difference δ (|d1−d2|=δ), the extension line of the adjacent edge 43 after the OPC is connected to the minute edge 52 after the parallel movement.

The difference |d1−d2| between the correction values d1 and d2 is not always coincident with the step difference δ because of the positional relationship of the slanting step difference with the peripheral pattern. However, the pattern correction method of this embodiment can be executed with the same processing even when the difference |d1−d2| is greater or smaller than and the step difference δ, as well.

Figure 6A:
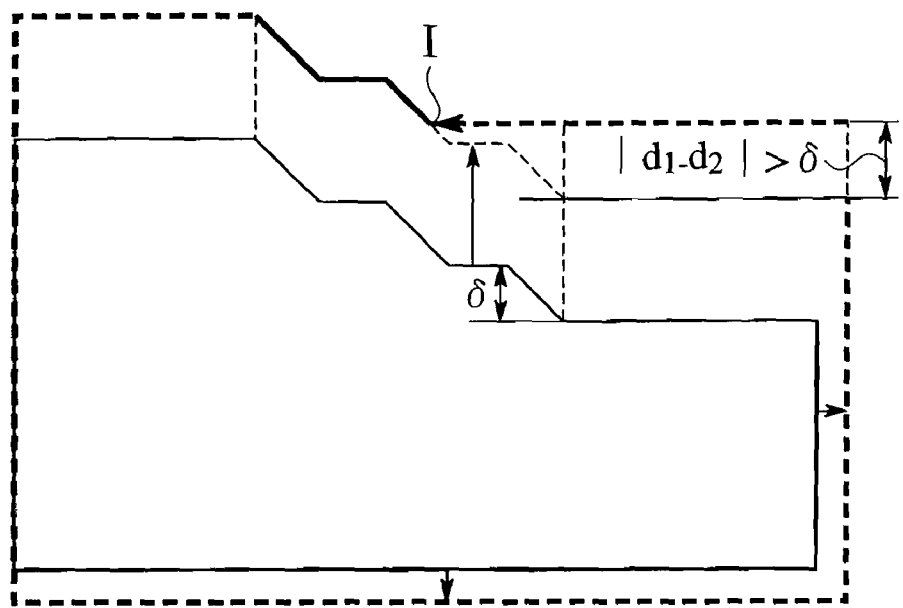
FIGS. 6A and 6B are plan views for explaining steps in FIG. 5D in detail.
Figure 6B:
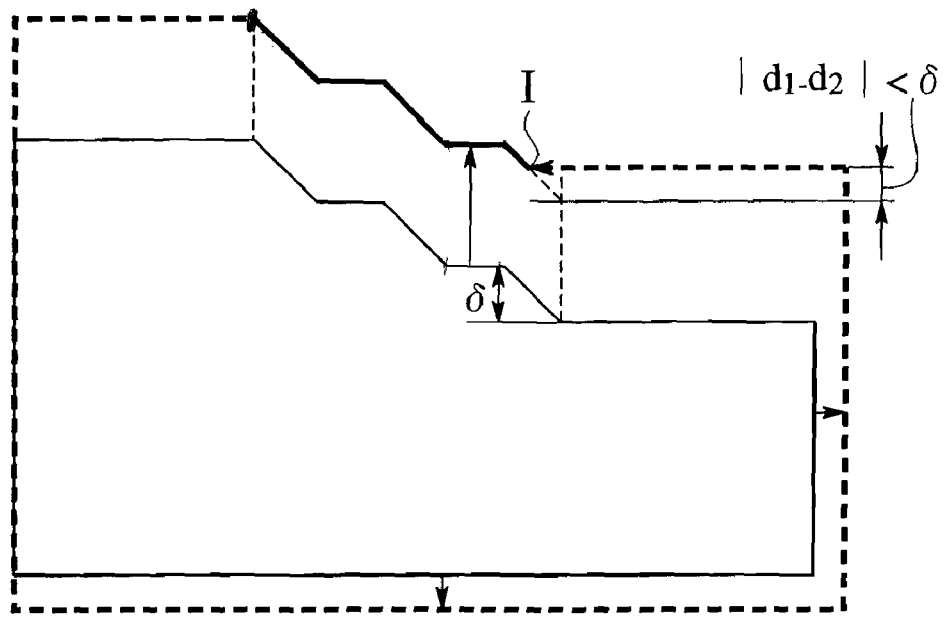
Figure 7A:
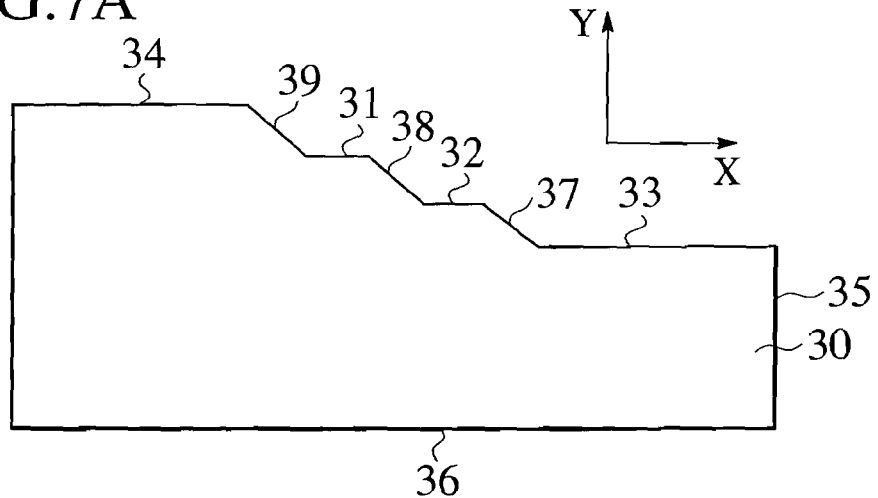
FIGS. 7A to 7C are plan views illustrating variations of the pattern correction method according to the second embodiment of the present invention.
Figure 7B:
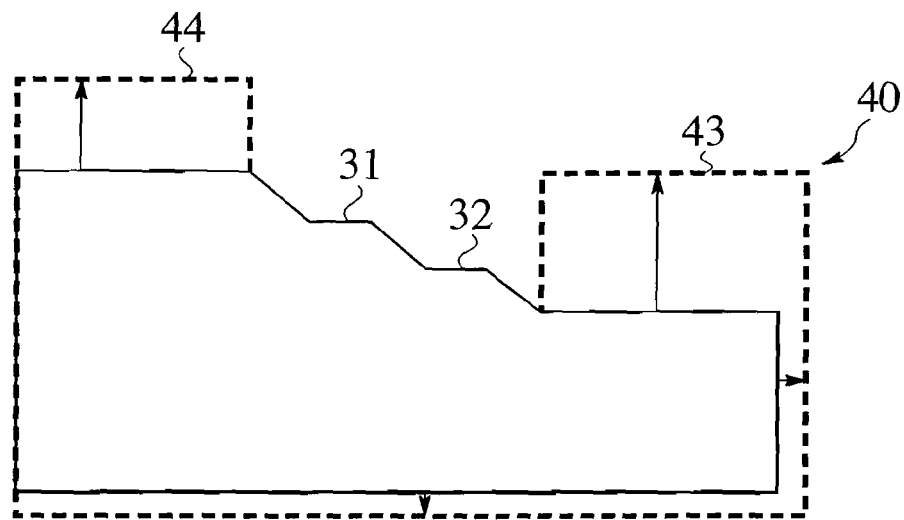
Figure 7C:
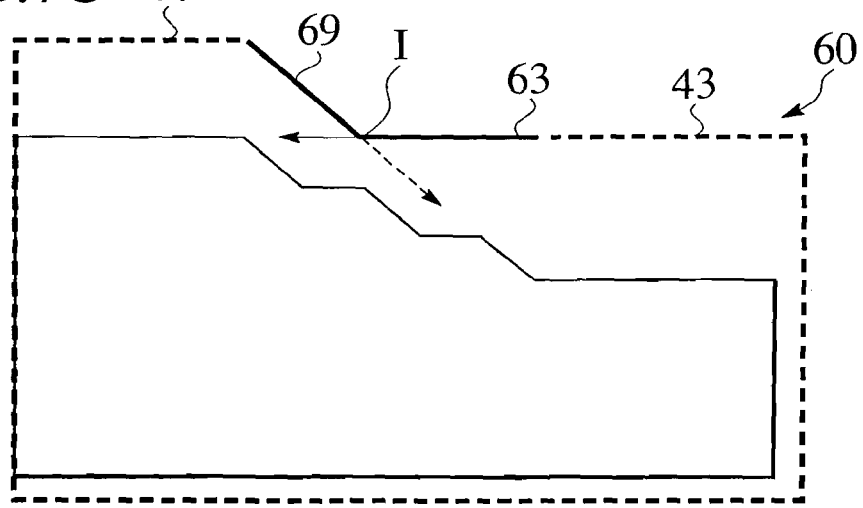

FIG. 6A illustrates a case where the difference between the correction values d1 and d2 is larger than the step difference δ (|d1−d2|>δ), and FIG. 6B illustrates a case where the difference between the correction values d1 and d2 is smaller than the step difference δ (|d1−d2|<δ). In any cases, the other adjacent edge after the OPC is extended in the line segment direction, and connected to the slanting step difference that has been moved in parallel at the intersection point I with this step difference. Thus, a good corrected mask pattern is obtained, which keeps a shape which is substantially the same as the design pattern FIGS. 7A to 7C illustrate variations of the pattern correction method illustrated in FIGS. 5A to 5D and FIGS. 6A and 6B. In FIGS. 5A to 5D and FIGS. 6A and 6B, shown was the mask pattern correction method in which the slanting step difference composed of the slanting lines and the minute edges had relatively great significance. However, in some design pattern, there are cases where although the shape of a pattern has no great significance in terms of devices, the pattern connection is made by slanting lines. In such a case, the shape of the step difference, which is created by the slanting lines and the minute edges in the design pattern, is not required to keep the intact shape. Therefore, the mask pattern can be corrected with simpler processing.

Specifically, with respect to the pattern 30 of FIG. 7A, the correction values are determined for the edges 33 and 34 meeting the predetermined conditions, and the pattern 40 illustrated by the dotted lines is obtained as shown in FIG. 7B. The edge 33 becomes the line segment 43 by the correction, and the edge 34 becomes the line segment 44 by the correction. The processings of FIG. 7B is the same as those of FIG. 5B.

Next, as shown in FIG. 7C, any one of the adjacent edges 43 and 44 after the OPC is extended in the line segment direction thereof. Simultaneously, the minute edge, which is excluded from the object of the OPC and extends from the other adjacent edge, is moved in parallel by an amount equal to the correction value of the other adjacent edge, and extended. The two line segments are connected to each other at the intersection point of the extension line of the one adjacent edge after the OPC and the extension line of the line segment, which is moved in parallel and excluded from the object of the OPC.

In the example of FIG. 7C, the adjacent edge 43 after the OPC is extended in its line segment direction as shown by the arrow line 63. The minute slanting line 39 connected to the other edge 34 is moved in parallel in accordance with the correction value of the edge 34, and connected to the adjacent edge 44 after the OPC. The slanting line after the parallel movement 39 is extended in its line segment direction as shown by the arrow line 69. These two extension lines are connected at the intersection point I. As a result, the pattern 60 after the correction, which does not include minute hollows and acute portions at all, is obtained by the very simple processing.

Also in the second embodiment, like the first embodiment, it is unnecessary to determine the correction value with individual simulations for the minute portions. The correction pattern can be prepared by the simple processing in a short time by use of the results obtained by the ordinary OPC processing. Furthermore, acute shapes and minute unevenness, which are problems in checking the mask, are never left.

Similarly to the first embodiment, the processing illustrated in FIGS. 5C to 5D, in FIGS. 6A and 6B and FIG. 7C may be combined with the OPC processing, or alternatively performed separately from the OPC processing.

Third Embodiment

FIGS. 8A to 8E illustrate another correction method of a design pattern including a minute slanting step difference. In the second embodiment, when the design pattern includes the slanting step difference, the mask pattern was generated by the simple method while utilizing the slanting lines in the design data.

In the third embodiment, a pattern correction method for the case where slanting lines has almost no important significance on design data in an actual pattern transferred onto a wafer is provided.

Figure 8A:
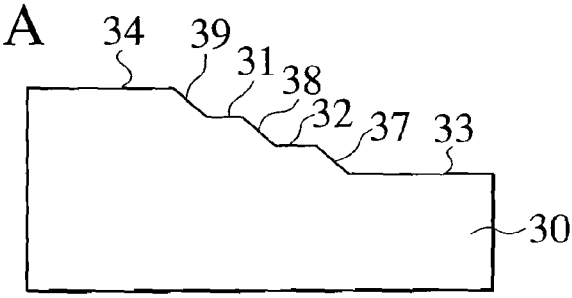
FIGS. 8A to 8D illustrate a pattern correction method according to a third embodiment of the present invention, which are plan views illustrating an effective method as preprocessing for OPC particularly.
Figure 8E:
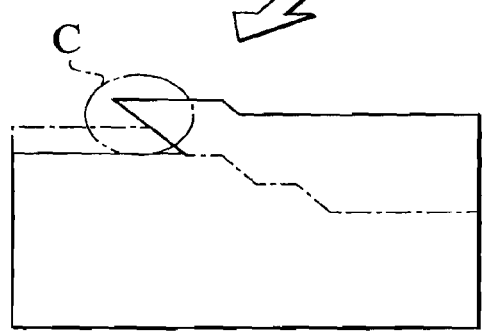
FIG. 8E is a plan view illustrating a pattern after the correction, as a comparison example, which is obtained by performing only the conventional OPC processing.
Figure 8B:
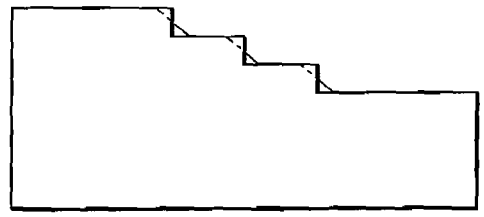
Figure 8C:
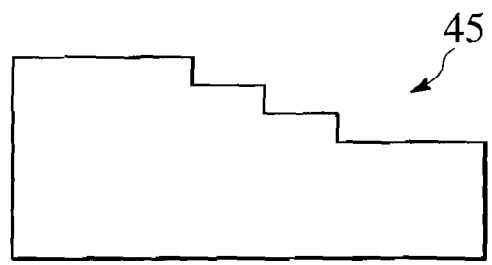

As shown in FIG. 8B, the minute slanting lines 37, 38 and 39, which are excluded from the objects of the OPC, are first transformed to the pattern parallel with the rectangular coordinate axis. Thus, the pattern 45 composed of only the edges in the X and Y-directions is obtained as shown in FIG. 8C. The transform of the slanting lines to the pattern in the directions of the rectangular coordinate axes shown in FIGS. 8B and 8C may be executed as pre-processing prior to the OPC processing, or alternatively may be combined with the OPC processing.

Figure 8D:
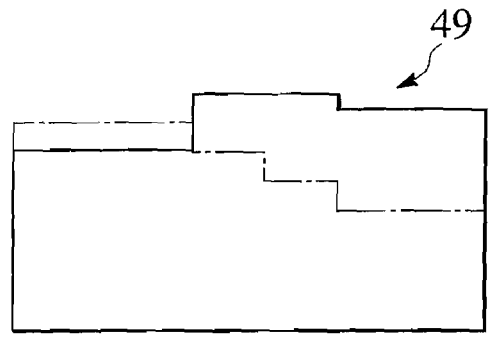

Next, as shown in FIG. 8D, the ordinary OPC processing is executed for the pattern 45 which does not include a slanting step difference. As a result, the mask pattern 49 which does not include minute unevenness and acute portions is obtained.

For the sake of comparison with the above, the pattern of FIG. 8E is obtained in the case where the pre-processing is not executed for the pattern 30 of FIG. 8A and only the conventional OPC processing is executed. When the conventional OPC processing alone is executed, undesirable acute projections and hollows occur, as shown in a circle C, and they decrease precision of a mask drawing, and they cause a suspected failure in checking the mask, thus causing erroneous check.

While, the method shown in FIGS. 8A to 8D can generate a mask pattern suitable for a mask drawing and a check, with simple processing like the first and second embodiments. Furthermore, since the slanting lines are transformed to the line segments along the rectangular coordinate axis in the third embodiment, an amount of data processing after the transform is decreased, and a correction time is shortened.

Fourth Embodiment

Figure 9A:
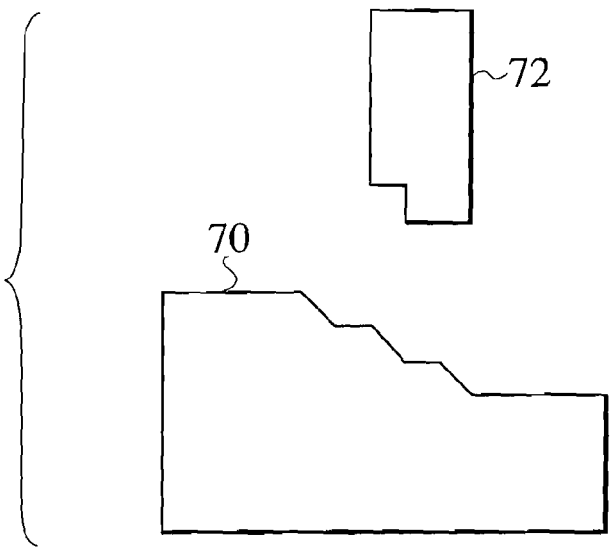
FIGS. 9A to 9C illustrate a pattern correction method according to a fourth embodiment of the present invention, which are plan views illustrating the pattern correction method capable of coping with the rule check of a mask design.
Figure 9B:
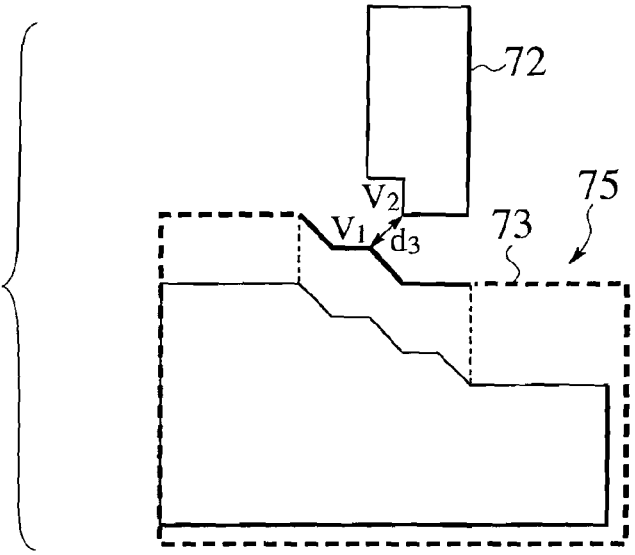
Figure 9C:
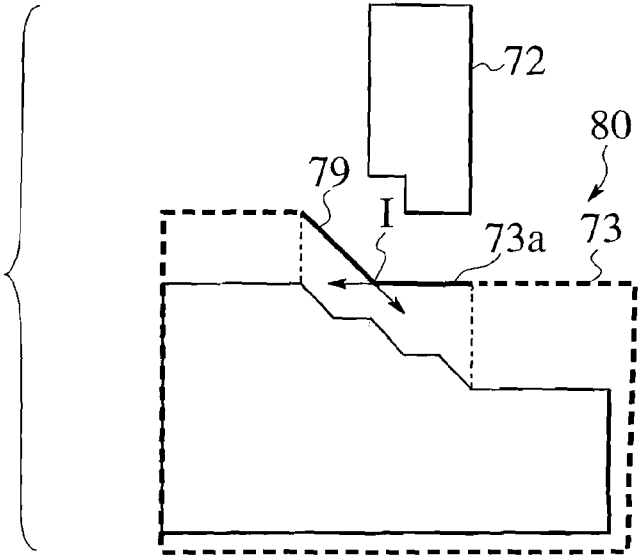

FIGS. 9A to 9C illustrate a pattern correction method according to a fourth embodiment of the present invention In the fourth embodiment, the pattern correction method in the case where violation against rules is detected in rule check after the pattern correction is shown. Usually, the OPC processing is executed for each pattern, and after one pattern is corrected, it is checked whether or not the corrected pattern meets a predetermined design rule. Even when the pattern correction itself is proper, the corrected pattern is sometimes against the design rule because of the positional relation between the corrected pattern and peripheral patterns, and the like.

For example, the case where the peripheral pattern 72 exists near the pattern 70 including a minute step difference on design data, as shown in FIG. 9A, is considered. It is assumed that the correction processing is executed for the aimed pattern 70 by use of the method illustrated in FIGS. 5A to 5D of the second embodiment, and the pattern 75 illustrated in FIG. 9B is obtained. In this case, the shape of the mask pattern 75 is a good pattern shape, which does not cause erroneous detection and takes an optical proximity effect into consideration.

Herein, rule check is executed for the corrected pattern 75, and it is verified whether the corrected pattern accords to the mask design rule. In the example of FIG. 9B, since the peripheral pattern 72 is located in the vicinity of the pattern 75, the patterns 72 and 75 are close to each other. When exposing is performed practically, the two patterns are likely to be short-circuited by coupling.

The positional relation between the two patterns 72 and 75 is considered in view of the shortest distance between the peripheral pattern 72 and the corrected pattern 75. Alternatively, the positional relation between them may be decided depending on whether or not the two patterns 72 and 75 are located within a range of a predetermined distance. For example, if the gap d3 is smaller than a predetermined threshold value in the mask design rule, the gap d3 being formed between the apex V1 in the corrected pattern 75, which is closest to the peripheral pattern 72, and the apex V2 in the peripheral pattern 72, the corrected pattern 75 is detected as the one which violates the design rule.

Accordingly, when the violation of the design rule is detected, correction processing is executed for the aimed pattern 70 by an alternative method as shown in FIG. 9C, and the aimed pattern 70 is transformed to a shape meeting the design rule. Specifically, the design pattern 70 is corrected by use of another alternative method, for example, the method of the second embodiment shown in FIGS. 5A to 5D, in stead of the pattern correction executed in FIG. 9B. By use of the method shown in FIGS. 7A to 7C specifically, by use of the method to connect the pattern at the intersection point I of the extension line 73a of the adjacent edge 73 after the OPC on one side of the slanting step difference and the extension line 79 after the parallel movement extending from the other adjacent edge, the corrected pattern 80 in accordance with the design rule is generated.

In the example shown in FIGS. 9A to 9C, the optical proximity effect correction is executed for the pattern 70 including the slanting step difference. When the design pattern is composed of only rectangular pattern, the method illustrated in FIG. 3 or FIG. 4 of the first embodiment may be adopted as an alternative corrective method after the rule check.

FIG. 10 illustrates a flowchart of the pattern correction processing of the fourth embodiment, which includes the foregoing rule check. First, in step S801, design data for use in a mask of an object layer for correction is inputted. Semiconductor devices and liquid crystal panels have a multilayered structure in which transistors and wiring layers are formed over many layers, and the mask pattern is also designed and prepared for the respective layers. The optical proximity effect correction for the design data is executed for each layer.

Next, as shown in step S803, an edge which meets predetermined conditions and is intended to be an object of the OPC processing is corrected. This correction is an ordinary OPC processing.

Subsequently, in step S805, a correction (transformation) is executed for a minute edge and a minute slanting step difference, which do not meet the predetermined conditions. For example, since the edge is shorter than predetermined length, it is excluded from the object of the OPC processing. The edge is referred to as a minute edge in FIG. 10. Such the minute edge is transformed by use of a first method selected from any one of the methods shown in the first and second embodiments.

To be concrete, as the first method, used are any one of the methods including (1) the one shown in FIGS. 3A to 3C, in which the minute edge is made to be coincident with one adjacent edge; (2) the one shown in FIGS. 4A to 4C, in which the minute edge is virtually split at the midpoint thereof and made to be respectively coincident with each of adjacent edges; (3) the one shown in FIGS. 5A to 5D, in which the minute slanting step difference is moved in parallel as it is, and connected to the extension lines of the adjacent edges; and (4) the one shown in FIGS. 7A and 7C, in which the slanting edge connected to one adjacent edge is moved in parallel, and the other adjacent edge is extended to be connected thereto at the intersection point.

Next, in step S807, it is decided for each minute edge whether the pattern after the correction (transformation) meets the mask design rule or not. If the pattern after the correction meets the mask design rule, that is "YES" in step S807, the procedure advances to step S815. It is verified whether there are minute edges that have not undergone the rule check yet. If there is a minute edge that has not undergone the rule check, the procedure returns to step S807, the rule check is executed for the next minute edge.

In step S807, if the pattern after the correction does not meet the design rule, that is "NO" in step S807, the procedure advances to step S809, and another method is selected from the methods shown in FIGS. 3A to 3C, FIGS. 4A to 4C, FIGS. 5A to 5D, and FIGS. 7A to 7C, and the correction (transformation) is tried for the aimed minute edge. A method used herein is called a second method.

After a correction by use of the second method, the rule check is again executed in step S811. If the pattern after the correction by use of the second method comes to meet the rule check, that is "YES" in step S811, the procedure advances to step S815. If there is a minute edge which has not undergone yet, the processing from step S807 onward are repeatedly executed.

If the pattern after the correction does not meet the design rule in spite of the execution of the correction by use of the second method, that is "NO" in S811, the procedure advances to step S813, and still another method is selected from the foregoing methods. Then the correction (transformation) is tried. The method used herein is called a third method.

After the correction (transformation) by the third method, it is decided in step S815 whether or not the rule check has been finished for all minute edges, and steps S807 to S815 are repeatedly executed until processing is finished for all minute edges.

In this method, without determining the correction value individually by simulation, it is possible to correct all minute edges included in the pattern so that the pattern is made to meet the mask design rule. Furthermore, since any of the methods shown in the first and second embodiments is used, undesirable minute unevenness and acute pattern never occur by the correction.

Although not illustrated, before the step S803 as required, the pre-processing shown in the third embodiment may be executed for some aimed pattern. That is, a processing may be executed for transforming a minute slanting step difference, which has no significance as a pattern shape on a wafer, to a pattern parallel with a rectangular coordinate axis. By inserting or incorporating this preprocessing, the processing after that becomes simpler.

Figure 11A:
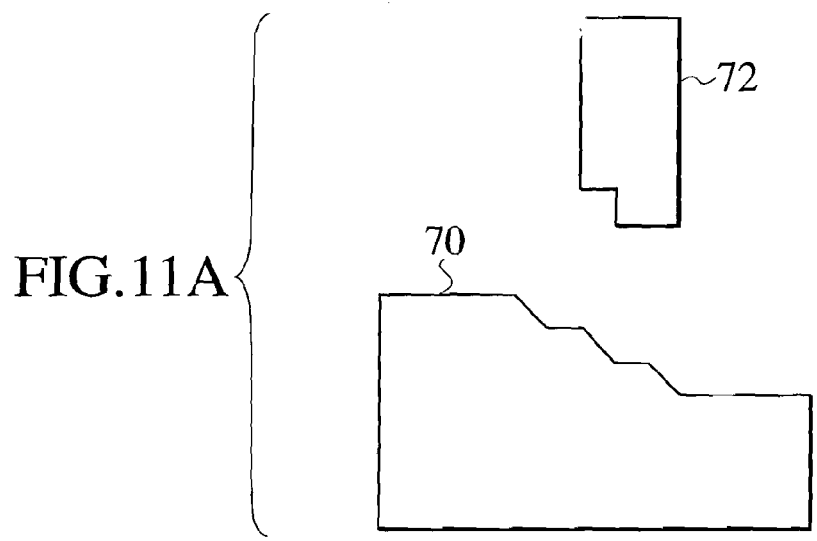
FIGS. 11A to 11C are plan views illustrating variations of the pattern correction method according to the fourth embodiment of the present invention.
Figure 11B:
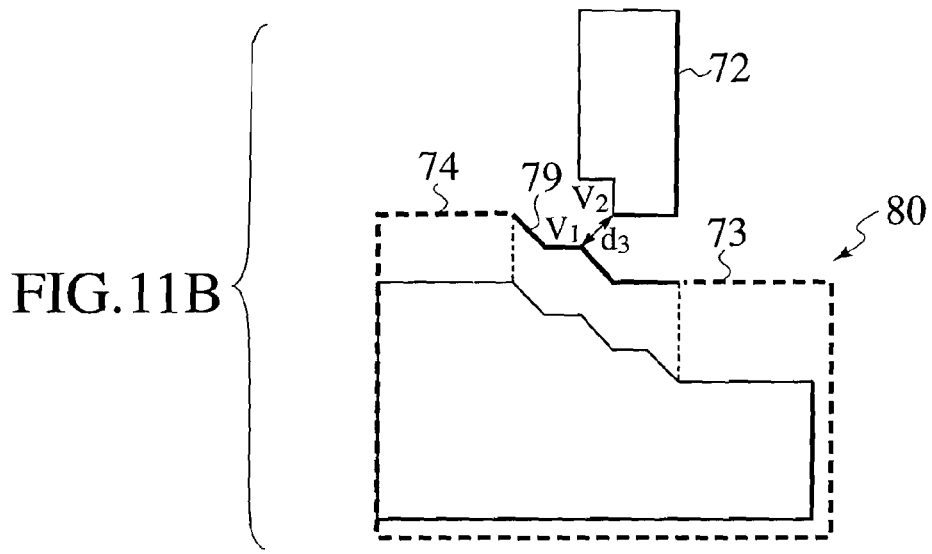
Figure 11C:
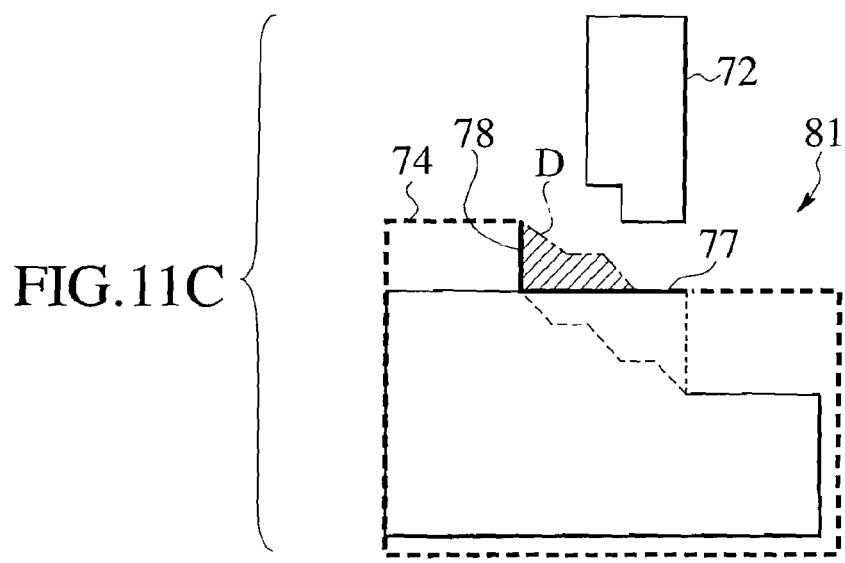

FIGS. 11A to 11C illustrate the variation of the pattern correction method after the rule check. In the method shown in FIGS. 9A to 9C and FIG. 10, the violation of the design rule is avoided by use of the alternative method while paying attention to the shape of the design pattern.

In the method illustrated in FIGS. 11A to 11C, when the violation of the design rule is detected, an area violating the design rule is cut away. This method is effective in the case where a step difference and a minute slanting line, which exist on design data, has no almost significance when they are transferred on a wafer.

As shown in FIGS. 11A and 11B, when the aimed pattern 70 is corrected by the method of the second embodiment shown in FIGS. 5A to 5D, it is assumed that the violation against the mask design rule is detected at the distance d3 between the pattern 80 which is a corrected pattern and the peripheral pattern 72 located near the pattern 80.

In FIG. 11C, the whole of the projection area D close to the peripheral pattern 72 is cut away by the line segment 77 in the X-direction and the line segment 78 in the Y-direction. The cut-away line segments 77 and 78 are respectively connected to the adjacent edges 73, 74 after the OPC processing, thus constituting the pattern 81 after the correction, which meets the design rule. The pattern 81 after the correction is corrected to a shape suitable for the mask drawing and the check without significant effect on the transferred shape on the wafer.

Figure 12:
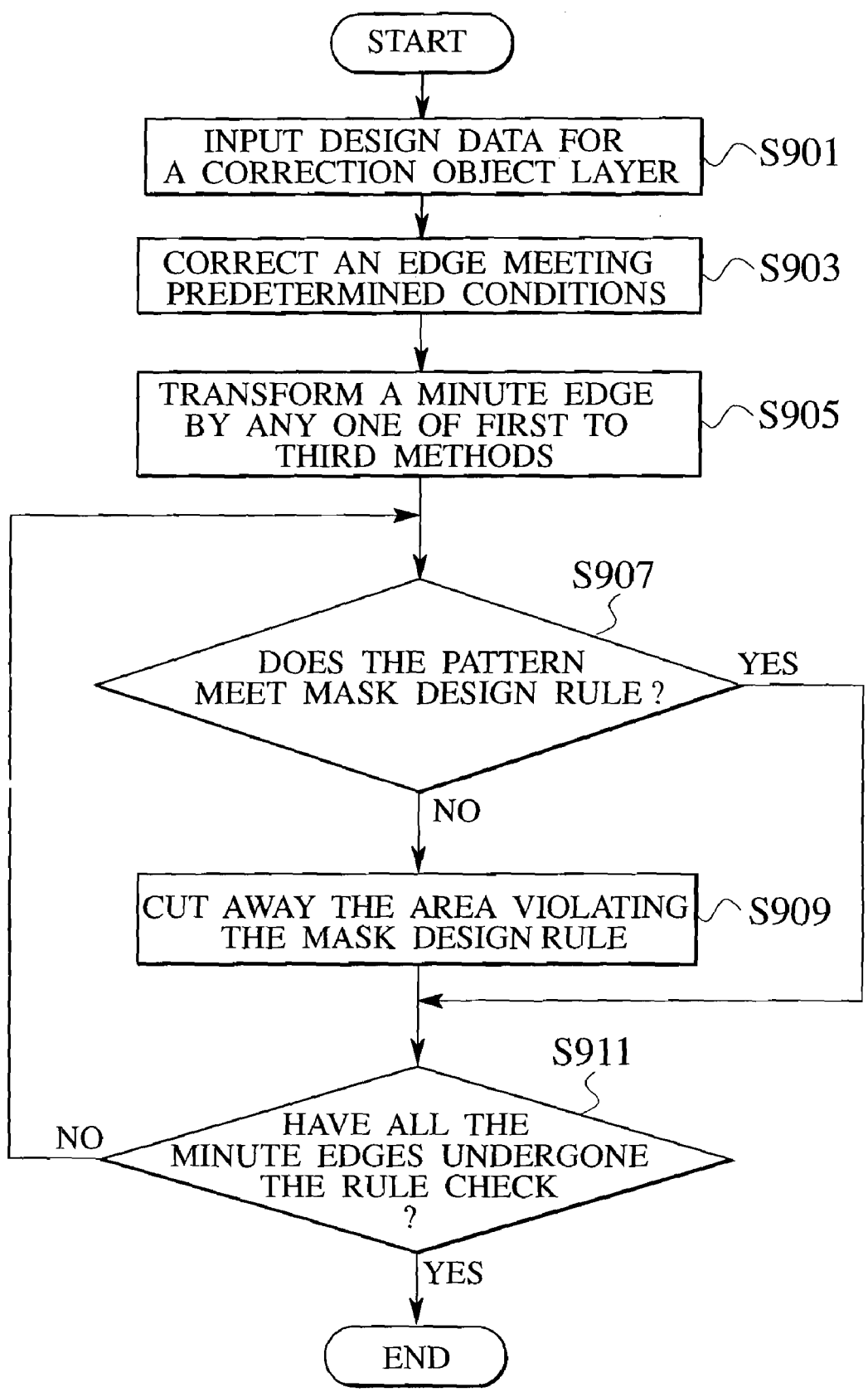
FIG. 12 is a flowchart illustrating the pattern correction method corresponding to FIGS. 11A to 11C.

FIG. 12 is a processing flowchart of the pattern correction method illustrated in FIGS. 11A to 11C.

First, in step S901, the mask design data for the correction object layer is inputted. In step S903, as to an aimed pattern, an edge meeting the predetermined conditions and being targeted for the OPC processing is corrected. This correction is an ordinary OPC processing.

Next, in step S905, the correction (transformation) is executed for a minute edge and a minute slanting step difference which is excluded from an object of the OPC because of the reason why they are shorter than a predetermined length and of other reasons.

Next, in step S907, for each minute edge, it is decided whether or not the pattern after the correction (transformation) meets the mask design rule. If the pattern meets the design rule, that is "YES" in step S907, the procedure advances to step S911, it is verified whether a minute edge that has not undergone the rule check yet exists or not. When there is the minute edge that has not undergone the rule check yet, the procedure returns to step S907, and the rule check is executed for a next minute edge.

In step S907, if the pattern after the correction (transformation) does not meet the design rule, that is "NO" in S907, the procedure advances to step S909, and an area corresponding to the violation of the rule is cut away.

Finally, in step S911, it is verified whether the rule check has been executed for all minute edges, and if there is a minute edge that has not undergone the rule check yet, the processing from step S907 onward is repeated.

The cut-away correction for the rule violation spot shown in FIG. 11C may be executed in stead of step S813 in the alternative method shown in FIGS. 9C and 10. Alternatively, the cut-away correction may be inserted in the step after the step S813. Thus, areas violating the design rule can be surely excluded from the mask pattern.

Fifth Embodiment

FIGS. 13A to 13G and FIGS. 14A to 14G illustrate a pattern correction method according to a fifth embodiment of the present invention In the fifth embodiment, provided is a method for erasing minute pattern not affecting a transferred image onto a wafer by bias processing and simple logic operation processing when a design pattern after OPC processing includes them.

As described above, a pattern after the OPC processing often includes minute unevenness. The unevenness adversely affects a mask drawing and a check in spite of the fact that it hardly has any influence on a transferred image onto a wafer. Therefore, the minute unevenness should be erased and flattened.

However, the conventional correction method creates new acute notches and acute projections in the course of erasing the minute unevenness. Accordingly, in the fifth embodiment, a mask pattern is corrected to a shape suitable for a mask drawing and a check with a small processing amount without leaving these acute portions. Particularly, in FIGS. 13A to 13G, a method for effectively erasing the acute notches created during a repairing stage after the OPC is illustrated In FIGS. 14A to 14G, a method for eliminating the acute projections is illustrated.

Figure 13A:
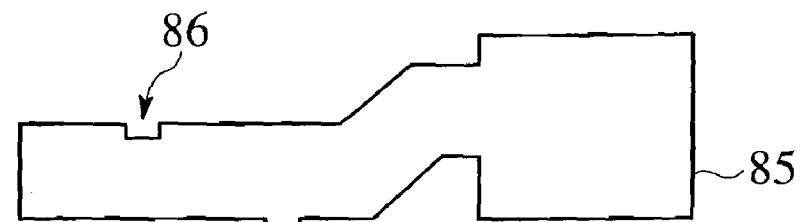
FIGS. 13A to 13G are plan views illustrating a pattern correction method according to a fifth embodiment of the present invention.

First, as shown in FIG. 13A, the pattern 85 is obtained by an ordinary OPC processing. Herein, it is detected whether or not the pattern 85 after the OPC processing includes minute unevenness. In this detection, determination is made, for example, depending on whether or not an aimed pattern includes unevenness which does not meet conditions predetermined in accordance with a line width and a line length thereof and the like. Herein, minute hollows and minute projections of 0.1 µm or less shall be a minute pattern.

In the case of FIG. 13A, the pattern 85 after the OPC processing includes the minute unevenness 86 and 87.

Figure 13B:
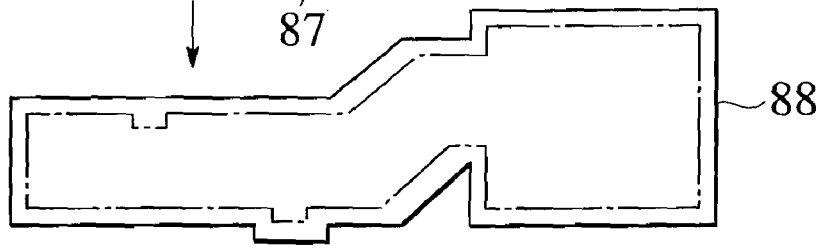
Figure 13C:
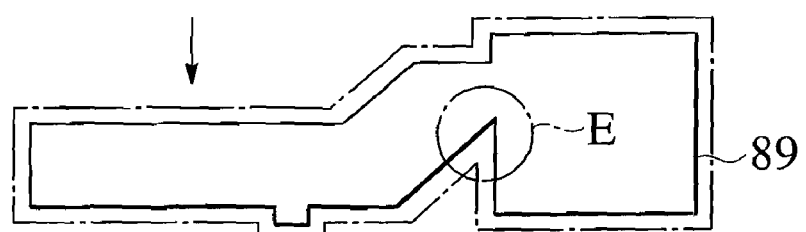

Accordingly, a slightly thick bias and a slightly thin bias respectively shown in FIGS. 13B and 13C are continuously applied to the pattern 85 (slightly thick/slightly thin bias), and the minute hollow 86 is erased. To be concrete, the pattern 85 is made to be thicker by 0.05 μm in FIG. 13B, and the thickened pattern 88 is made to be thinner by 0.05 μm in FIG. 13C.

The pattern 89 in which the minute hollow 86 is erased is obtained by the slightly thick/slightly thin bias processing. However, as a result of the bias processing, the acute notch E newly occurs. Such a notch like the notch E causes an erroneous detection in the mask drawing and the check and is undesirable.

Figure 13D:
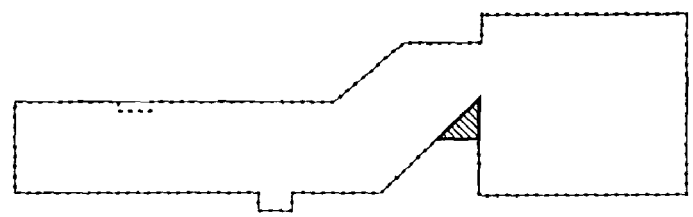
Figure 13E:
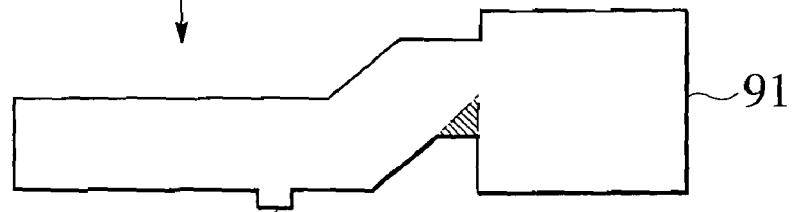

Accordingly, as shown in FIGS. 13D and 13E, the notch E is buried, and the pattern 91 in which the notch is erased is obtained. The erasure of the notch is realized in such a manner that a "FIG. 13A NOT FIG. 13C" operation is executed to get the state of FIG. 13D, and a "FIG. 13C OR FIG. 13D" operation is executed. The shape in FIG. 13E is obtained by the operations.

The minute hollows 86 can be erased by the processing until FIG. 13E without creating unnecessary acute portions in the pattern 85 after the OPC processing.

Figure 13F:
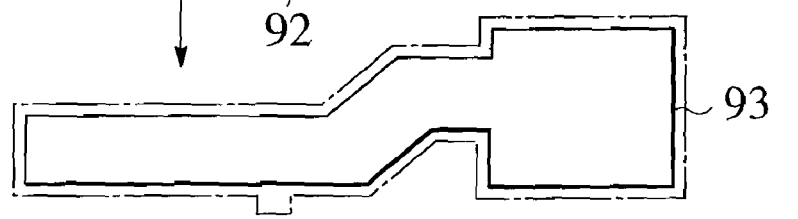
Figure 13G:
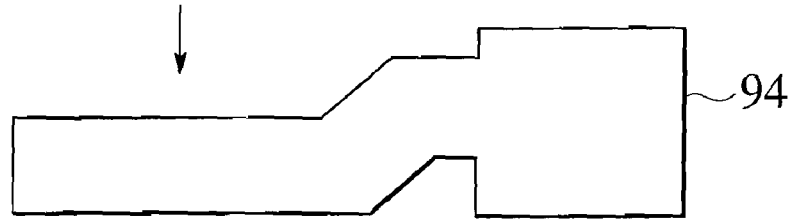

Next, as shown in FIGS. 13F and 13G, the remaining minute projection 87 is erased by applying a slightly thick/slightly thin bias to the pattern. Specifically, the pattern 91 obtained in FIG. 13E is made to be thinner by 0.05 μm, and the state of the pattern 93 in FIG. 13F is obtained. The pattern 93 is further made to be thicker by 0.05 μm, whereby the final pattern 94 illustrated in FIG. 13G is obtained.

As described above, by applying the proper repair to the pattern after the OPC processing, the minute unevenness can be effectively erased.

An example in which an acute projection is erased is shown in FIGS. 14A to 14G. In this example, the pattern 100 after the OPC processing, which has the minute hollow 101 and the minute projection 102 to be subjected to repair.

First, the slightly thick/slightly thin bias processing in which the pattern 100 is sequentially made to be thicker and thinner by 0.05 μm is executed for the pattern 100 from FIGS. 14A to 14C like FIGS. 13A to 13C. The pattern 103 in which the minute hollow 101 is erased is obtained by these processing.

Next, as shown in FIGS. 14D and 14E, the slightly thick/slightly thin bias processing of 0.05 μm is executed for the pattern 103.

The pattern 107 of FIG. 14D, in which the minute projection 102 is erased, is obtained by the slightly thick/slightly thin bias processing. However, the acute projection F is newly created. The acute projection F created during the repairing step can not be erased by the conventional method, and may cause a suspected failure in the mask drawing and the check.

Accordingly, as shown in FIGS. 14F and 14G, a "FIG. 14E NOT FIG. 14C" operation is executed, thus getting the state of FIG. 14F, and then a "FIG. 14E NOT FIG. 14F" operation is further executed.

Thus, the good pattern shape 109 in which the minute hollow 101 and the minute projection 102 are erased from the pattern 100 after the OPC processing is obtained without creating undesirable acute projections.

The acute notches and hollows, which are created during the repairing step after the OPC processing, can be simply erased with a small operation amount by properly using the foregoing bias repair and logic operations. Thus, the pattern correction suitable for the mask drawing and the check can be executed.

In the descriptions for the fifth embodiment, the case where the pattern repair is executed after the OPC processing was made. However, the pattern repair can be incorporated in the OPC processing.

Any of the methods shown in the first to fifth embodiments can be directly installed as a pattern correction program in a pattern generation/correction apparatus such as a CAD, either by being incorporated in an ordinary OPC or independently from the ordinary OPC. This program may be once stored in a magnetic disc, an optical disc, a magneto-optical disc (MO disc), a magnetic tape, floppy disc, CD-ROM, cassette tape and the like.

The present invention was hitherto described based on the embodiments, and the present invention is not limited to the foregoing embodiments. Combinations of the embodiments are possible according to demand. For example, a program can be made so that the pre-processing shown in the third embodiment is followed by the ordinary OPC, and the pattern correction meeting the design rule of the fourth embodiment is executed. In addition to this, a program may be made so that the bias processing of the fifth embodiment is executed after the ordinary OPC processing.

When a semiconductor device is manufactured by use of such pattern correction method, first a pattern to be formed on a semiconductor wafer is designed for each layer. The optical proximity effect correction shown in the first to fifth embodiments is executed for the designed pattern, thus preparing mask data. A mask for each layer is manufactured based on the mask data. The pattern is transferred onto the semiconductor wafer by use of the manufactured mask.

Harmful results such as pattern-shrink caused by exposing can be prevented by use of such manufacturing method of the semiconductor device.

As described above, according to the correction method of the present invention, without executing simulations individually, the pattern correction can be executed with simple processing in a short time for minute edges and minute unevenness that are excluded from objects of the OPC.

Furthermore, since new unevenness and acute portions are not created during the pattern correction steps, the erroneous detection in the mask drawing and the check can be prevented.

Still furthermore, since the pattern is corrected so as to meet the mask design rule, the final mask pattern suitable for the mask manufacture can be obtained.

What is claimed is:

1. A manufacturing method of a semiconductor device comprising:
   preparing design data in which patterns to be formed on a semiconductor wafer are designed for respective layers;
   inputting the design data for each layer, thus preparing mask data for each pattern included in the design data, the preparing the mask data including:
   (1) executing a first correction for one or a plurality of first edges meeting a condition for optical proximity effect among edges constituting a designed pattern, by calculating one or a plurality of first correction values, each having a value conforming to the condition and correcting one or the plurality of first edges with the calculated one or plurality of first correction values; and
   (2) executing a second correction for a second edge which does not meet the condition, by correcting the second edge with a second correction value, the second correction value being equal to one of the first correction values, which corresponds to one of the first edges adjacent to the second edge, thus connecting the corrected one of the adjacent first edges and the corrected second edge by a line segment;
preparing a mask based on the mask data; and
transferring the pattern onto the semiconductor wafer by use of the mask.

2. The manufacturing method according to claim 1, wherein preparing the mask data further comprises:
deciding whether or not a pattern after the second correction meets a design rule; and
cutting away a spot violating the design rule when the pattern after the second correction does not meet the design rule.

3. The manufacturing method according to claim 2, wherein the cut away processing is executed in a manner that the spot is cut away at an extension line of an adjacent edge which has been undergone the first correction, the extension line being adjacent to the spot which does not meet the design rule.

4. The manufacturing method according to claim 1, wherein preparing the mask data further comprises:
transforming all of the first edges which do not meet the condition to edges in parallel with rectangular coordinates axis, before the first correction.

5. The manufacturing method according to claim 1, wherein the condition is that a length of an edge is equal to a certain value or more.

6. The manufacturing method according to claim 1, wherein the correction value of the first correction is calculated by a simulation.

7. A manufacturing method of a semiconductor device comprising:
preparing design data in which patterns to be formed on a semiconductor wafer are designed for respective layers;
inputting the design data for each layer, thus preparing mask data for each pattern included in the design data, the preparing the mask data including the following (1) to (4):
(1) executing a correction for edges meeting a condition in consideration for an optical proximity effect;
(2) deciding whether or not the pattern after the correction includes minute pattern having no effect on a transferred image onto the wafer;
(3) executing bias processing in combination of bias for thickening the whole of the pattern after the correction and bias for thinning it when the corrected pattern includes the minute pattern; and
(4) executing a logic operation after the bias processing, thus erasing an acute pattern caused by the bias processing;
preparing a mask based on the mask data; and
transferring the pattern onto the semiconductor wafer by use of the mask.

8. A computer program product stored on a computer readable storage medium and configured to be executed by a computer, the program product comprising:
designing a pattern to be formed on a wafer;
executing a correction for at least one of edges meeting the condition among the edges constituting the designed pattern in consideration for an optical proximity effect;
deciding whether or not the corrected pattern includes minute pattern having no effect on a transferred image onto the wafer;
executing bias processing in combination of bias for thickening the whole of the pattern after the correction and bias for thinning bias it when the corrected pattern includes the minute pattern; and
executing a logic operation after the bias processing, thus erasing an acute pattern caused by the bias processing.

9. A manufacturing method of a semiconductor device comprising:
preparing design data in which patterns to be formed on a semiconductor wafer are designed for respective layers;
inputting the design data for each layer, thus preparing mask data for each pattern included in the design data, the preparing the mask data including:
executing a first correction for a plurality of first edges meeting a condition for optical proximity effect among edges constituting a designed pattern, by calculating a plurality of first correction values, each having a value conforming to the condition and correcting the plurality of first edges with the calculated first correction values; and
executing a second correction for a second edge which does not meet the condition, by correcting one side of the second edge to be coincident with one of the first correction values of a first edge adjacent to the one side of the second edge, and correcting the remaining side of the second edge to be coincident with another one of the first correction values of a first edge adjacent to the other side of the second edge, thus connecting the corrected one side and the other side of the second edge with a line segment;
preparing a mask based on the mask data; and
transferring the pattern onto the semiconductor wafer by use of the mask.

10. A manufacturing method of a semiconductor device comprising:
preparing design data in which patterns to be formed on a semiconductor wafer are designed for respective layers;
inputting the design data for each layer, thus preparing mask data for each pattern included in the design data, the preparing the mask data including:
executing a first correction for a plurality of first edges meeting a condition for optical proximity effect among edges constituting a designed pattern, by calculating a plurality of first correction values, each having a value conforming to the condition and correcting the plurality of first edges with the calculated first correction values; and
executing a second correction for a plurality of second edges which do not meet the condition, by correcting the second edges so that the corrected second edges are parallel to the second edges and that one end point of one of the corrected second edges is coincident with a corrected first edge adjacent to the end point of the one of the second edges; and
extending another corrected first edge adjacent to another one of the second edges, so that the extended corrected first edge intersects the another one of the corrected second edges;
preparing a mask based on the mask data; and
transferring the pattern onto the semiconductor wafer by use of the mask.

11. A manufacturing method of a semiconductor device comprising:
preparing design data in which patterns to be formed on a semiconductor wafer are designed for respective layers;
inputting the design data for each layer, thus preparing mask data for each pattern included in the design data, the preparing the mask data including:
executing a first correction for one or a plurality of first edges meeting a condition for optical proximity effect among edges constituting a designed pattern, by calculating a plurality of first correction values, each having a value conforming to the condition and correcting the one or the plurality of first edges with the calculated first correction values;

executing a second correction for one or a plurality of second edges which does not meet the condition by one method selected from the following methods:

(1) a first method comprising:
correcting the second edge by making it be coincident with the one of the first correction values of a first edge adjacent to one side of the second edge; and
connecting an end portion of the other side of the corrected second edge and another corrected first edge adjacent to the other side of the corrected second edge, by a line segment;

(2) a second method comprising:
correcting one side of the second edge to be coincident with one of the correction values of a first edge adjacent to the one side of the second edge and correcting the remaining side of the second edge to be coincident with another one of the first correction values of a first edge adjacent to the other side of the second edge; and
connecting the corrected one side and the other side of the second edge with a line segment; or (3) a third method, comprising:
correcting the second edges so that the corrected second edges are parallel to the second edges and that one end point of one of the corrected second edges is coincident with a corrected first edge adjacent to the end point of the one of the second edges;
extending another corrected first edge adjacent to another one of the second edges, so that the extended corrected first edge intersects the another one of the corrected second edges;
wherein after the second correction, the pattern correction method further comprising:
deciding whether or not a pattern after the second correction meets a design rule; and
executing a third correction for the one or the plurality of second edges by use of another method among the methods (1) to (3) different from a method selected in the second correction, when the pattern after the second correction does not meet the design rule;

preparing a mask based on the mask data; and transferring the pattern onto the semiconductor wafer by use of the mask.

* * * * *